(12) United States Patent
Ni

(10) Patent No.: US 7,490,277 B2
(45) Date of Patent: Feb. 10, 2009

(54) PERIPHERAL CONNECTOR WITH BOUNDARY-SCAN TEST FUNCTION

(75) Inventor: Hsiang-Chih Ni, Taipei (TW)

(73) Assignee: Askey Computer Corporation, Taipei (TW)

( * ) Notice: Subject to any disclaimer, the term of this patent is extended or adjusted under 35 U.S.C. 154(b) by 366 days.

(21) Appl. No.: 11/500,477

(22) Filed: Aug. 8, 2006

(65) Prior Publication Data
US 2007/0198884 A1 Aug. 23, 2007

(30) Foreign Application Priority Data
Jan. 27, 2006 (TW) ............................... 95202094 U

(51) Int. Cl.
*G01R 31/28* (2006.01)
(52) U.S. Cl. ....................... 714/727; 361/785
(58) Field of Classification Search ................... 361/90, 361/758; 324/158.1, 754; 710/18; 714/39, 714/727
See application file for complete search history.

(56) References Cited

U.S. PATENT DOCUMENTS 5,852,743 A * 12/1998 Yeh .............................. 710/18
6,321,349 B1 * 11/2001 Hennessy ..................... 714/39
6,813,164 B2 * 11/2004 Yen ............................. 361/785
7,339,385 B2 * 3/2008 Takasu et al. ............... 324/754
2006/0132119 A1 * 6/2006 Collins et al. ............. 324/158.1
2006/0245131 A1 * 11/2006 Ramey et al. ................. 361/90

* cited by examiner

*Primary Examiner*—David Ton
(74) *Attorney, Agent, or Firm*—Browdy and Neimark, P.L.L.C.

(57) ABSTRACT

A peripheral connector includes a peripheral signal terminal set and a test signal terminal set for respectively electrically connecting a peripheral interface and a boundary scan interface of a microcomputer. A socket is selectively connectable to a peripheral device for data transmission between the peripheral device and the microcomputer or a test module for conducting a boundary scan test on the microcomputer. A converting unit has a logic circuit and a transmission circuit. The logic circuit converts an electric potential, which is transmitted from the socket and corresponds to one of the peripheral device and the test module that is connected to the socket, into a digital control signal for controlling enablement or disablement of the transmission circuit. The test module is able to conduct a boundary scan test on the microcomputer only when the transmission circuit is enabled.

8 Claims, 2 Drawing Sheets

PERIPHERAL CONNECTOR WITH BOUNDARY-SCAN TEST FUNCTION

BACKGROUND OF THE INVENTION

1. Field of the Invention

The present invention relates to computer peripheral equipments and more particularly, to a peripheral connector combined with boundary-scan test function.

2. Description of the Related Art

The on-board test technique to the input/output devices of an integrated circuit or printed circuit board is specified by boundary scan test of the design for test, i.e., the so-called JTAG (Joint Test Action Group) test protocol. It is the application of a scan path at each boundary (I/O) pin of on-board ICs or PCB circuits then accessing the test result for observing the circuit performance via scan operation. Therefore, the JTAG test technique consists of monitoring the I/O signalling, the integrity of interconnections, and logic operation functionality, etc. This provides a high reliability test to a circuit system.

JTAG test architecture comprises a test access port (TAP), allowing input and output of logic test command, test data, and test results, etc. Therefore, the TAP works as a serial interface accessed by an external test mainframe of a remote controller. Structurally, JTAG test architecture facilitates initial circuit design test and posterior system monitoring or serial communication application. However, because the test access port is a hardware connection port exposed to the outside of the circuit system, it is an unnecessary extra connector in a final product, for example, computer system to an ordinary user. Therefore, the manufacturer may remove the test access port to eliminate the risk of circuit contamination by the environment, or keep and hide the test access port for further use of product maintain test. However, keeping the test access port is not a good way because an additional mounting procedure is necessary when the posterior test work is required. Moreover, it degrades the efficiency of circuit design space on the circuit board as an extra circuit board space must be provided for hiding the test access port. Therefore, this method does not maintain the quality and the efficiency of practical use while keeping JTAG test function.

SUMMARY OF THE INVENTION

The present invention has been accomplished under the circumstances in view. It is the main object of the present invention to provide a peripheral connector combined with boundary scan test function, which allows the connection of a peripheral device and facilitates the operation of boundary scan test for on-board circuit, effectively integrating peripheral interfaces of a computer system.

To achieve this object of the present invention, the peripheral connector comprises a peripheral signal terminal set for electrically connecting a peripheral interface of a microcomputer and a test signal terminal set for electrically connecting a boundary scan interface of the microcomputer. The peripheral connector further comprises a socket and a converting unit. The socket has an input terminal set, a switching terminal set and a transmission terminal set. The input terminal set is for the connection of one of a peripheral device compatible to the peripheral interface and a test module compatible to the boundary scan interface. The switching terminal set is adapted to detect one of the peripheral device and the test module that is electrically connected to the input terminal set, and to output an electric potential corresponding to the detected result. The transmission terminal set is a digital data transmission interface electrically connected to the peripheral signal terminal set and the converting unit. The converting unit comprises a logic circuit and a transmission circuit. The transmission terminal set and the test signal terminal set are electrically coupled by the transmission circuit for enabling the test module to conduct a boundary scan test on the microcomputer. The logic circuit is electrically connected to the switching terminal set and the transmission circuit and adapted to convert the outputted electric potential of the switching terminal set into a digital control signal for controlling enablement or disablement of the transmission circuit.

DETAILED DESCRIPTION OF THE INVENTION

Figure 1:
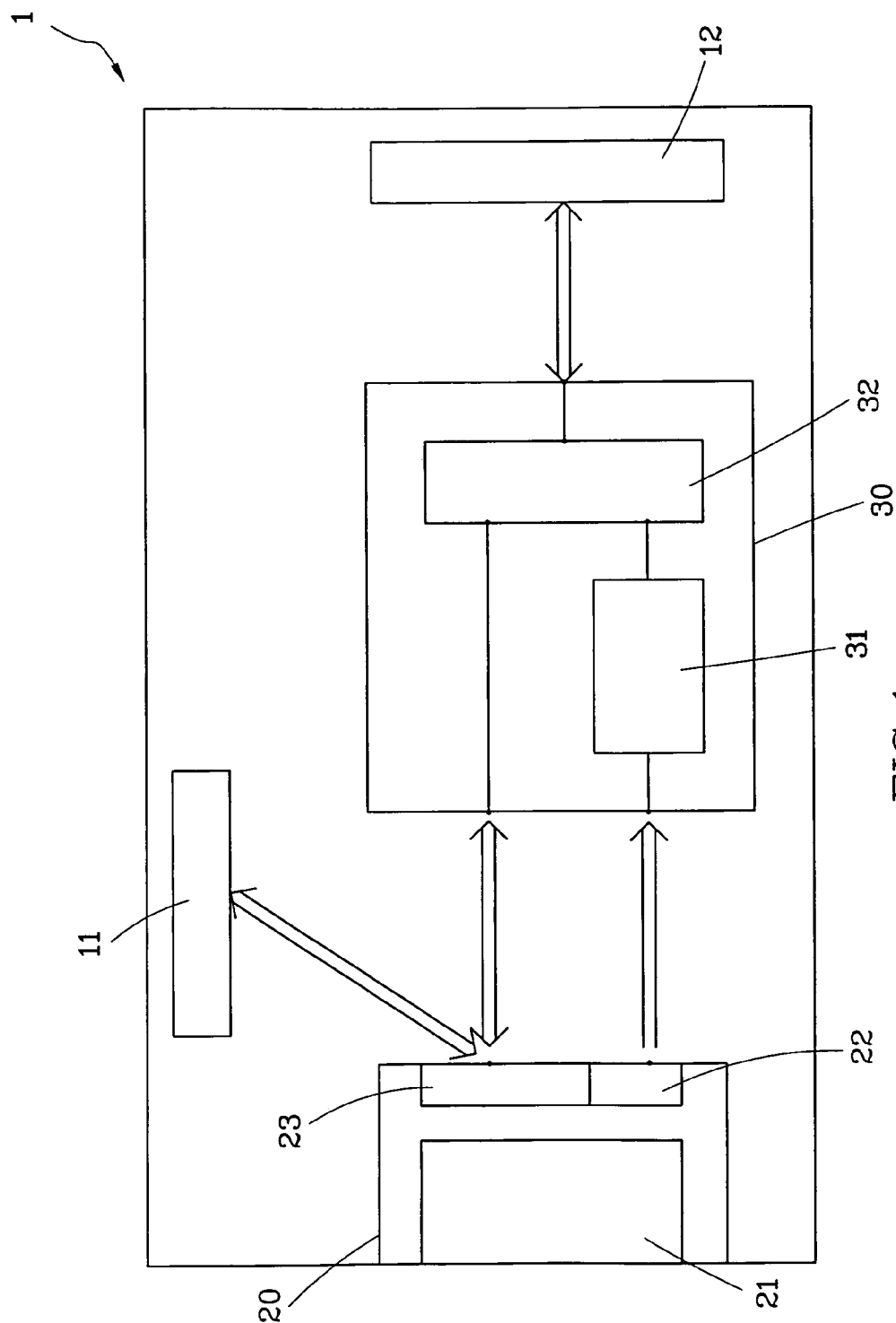
FIG. 1 is a circuit block diagram of a peripheral connector in accordance with a first embodiment of the present invention.

Referring to FIG. 1, a peripheral connector 1 in accordance with a first embodiment of the present invention is shown comprising a peripheral signal terminal set 11, a test signal terminal set 12, a socket 20, and a converting unit 30.

The peripheral signal terminal set 11 and the test signal terminal set 12 are electrically connected to a peripheral interface (not shown) and a boundary scan interface (not shown) of a microcomputer (not shown) respectively.

The socket 20 has an input terminal set 21, a switching terminal set 22, and a transmission terminal set 23. The socket 20 is adapted to receive a peripheral device compatible to the peripheral interface or a boundary scan test module compatible to the boundary scan interface. Either the peripheral device or the test module must be connected to the input terminal set 21 electrically for transmission digital data through the transmission terminal set 23. The switching terminal set 22 is adapted to detect the type of the device that is connected to the input terminal set 21 and to output a corresponding electric potential. The transmission terminal set 23 is a digital data transmission interface electrically connected to the peripheral signal terminal set 11 and the converting unit 30.

The converting unit 30 comprises a logic circuit 31 and a transmission circuit 32. The logic circuit 31 is electrically connected to the switching terminal set 22 and the transmission circuit 32, and adapted to convert the outputted electric potential of the switching terminal set 22 into a digital control signal for controlling the transmission circuit 32 to be enabled or disabled. The transmission terminal set 23 and the test signal terminal set 12 are electrically coupled when the transmission circuit 32 is turned on, for enabling the aforesaid test module to conduct a boundary scan test on the microcomputer.

Therefore, when the user connects the aforesaid peripheral device to the peripheral connector 1, the switching terminal set 22 senses the presence of the peripheral device on the input terminal set 21 and then sends out an electric potential to the logic circuit 31, causing the logic circuit 31 to disable the transmission circuit 32, thereby enabling the peripheral device and the microcomputer to transmit digital data to each other through the transmission terminal set 23 and the peripheral signal terminal set 11. When it's necessary to test the I/O devices of a high-speed IC chip or a microprocessor or a printed circuit board of the microcomputer, the aforesaid test module is plugged in the peripheral connector 1. Upon insertion of the test module into the peripheral connector 1, the switching terminal set 22 senses the test module connected to the input terminal set 21 and sends out an electric potential, thereby causing the logic circuit 31 to enable the transmission circuit 32, transmitting the logic command and test data sent out by the test module to the microcomputer through the transmission terminal set 23 and the test signal terminal set 12, and then sending back the test result from the microcomputer. Simply by connecting the test module to the peripheral connector 1, the microcomputer can complete the boundary scan test easily without the procedure of taking out the test access port from the circuit board again as performed in the prior art design.

Figure 2:
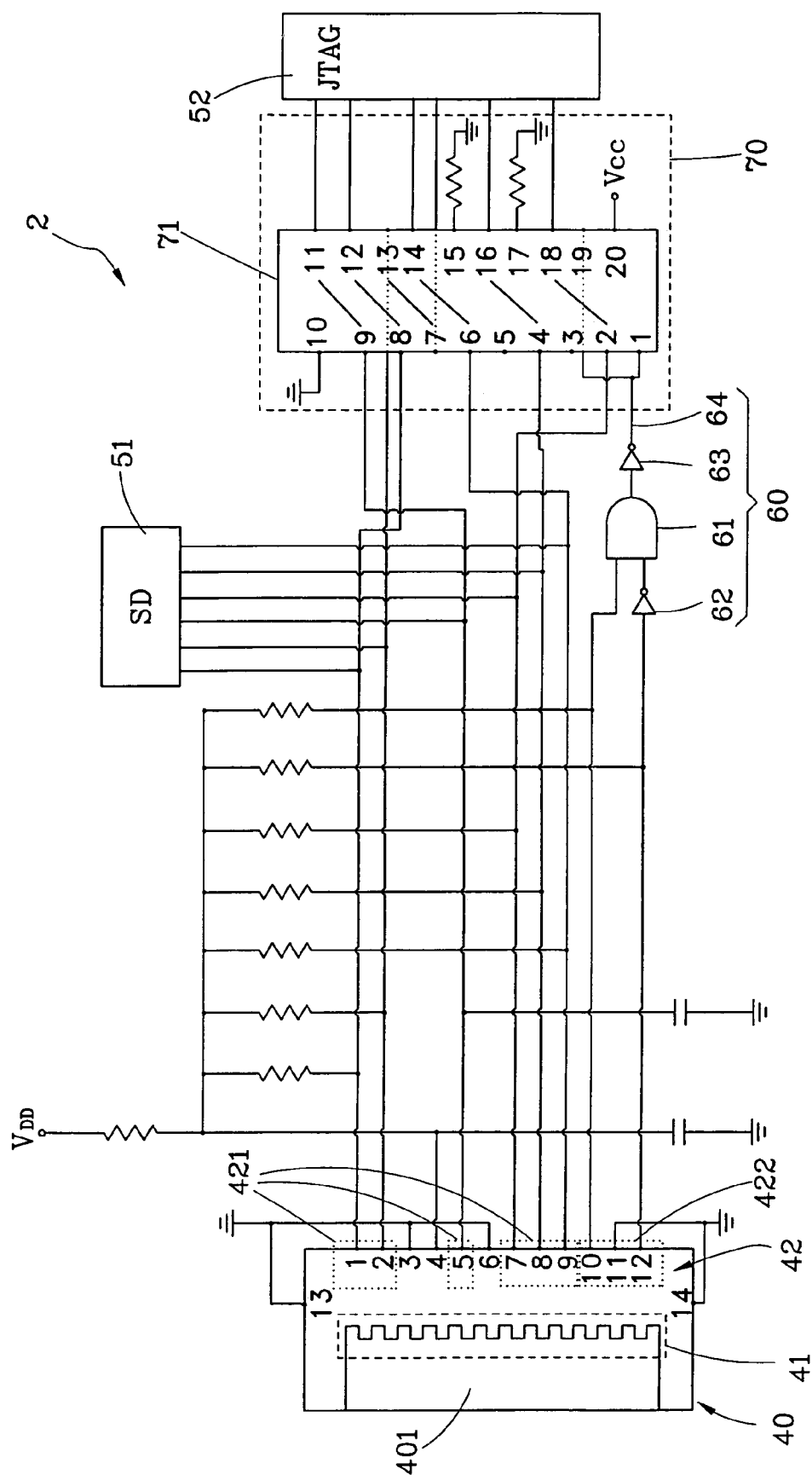
FIG. 2 is a circuit diagram of a peripheral connector in accordance with a second embodiment of the present invention.

FIG. 2 shows a peripheral connector 2 in accordance with a second embodiment of the present invention. This embodiment uses a popular SD card (Secure Digital Input/Output Card) related interface for application to a JTAG test connection. The peripheral connector 2 comprises a socket 40, a SD interface 51, a JTAG interface 52, a logic circuit 60, and a transmission circuit 70.

The socket 40 has an accommodation chamber 401, a plurality of metal connection terminals 41, and a plurality of signal pins 42. The accommodation chamber 401 is adapted to receive a SD card or JTAG test module. When a SD card or JTAG test module is inserted into the accommodation chamber 401, the metal connection terminals 41 are electrically connected to the inserted SD card or JTAG test module and worked as an input terminal set. The signal pins 42 respectively correspond to the metal connection terminals 41, each of which has a specific electric function. The signal pins 42 include two groups, namely, the transmission terminal set 421 for transmitting digital data and the switching terminal set 422 for outputting an electric potential to operate the logic circuit 60. The transmission terminal set 421 is electrically connected to the SD interface 51 and the transmission circuit 70, having 6 signal pins for digital signal transmission, including bidirectional data transmission and logic command and clock-sequential controlled signaling from the SD interface 51. The switching terminal set 422 is electrically connected to the logic circuit 60. When the socket 40 receives a SD card, PIN10 is disabled, thereby outputting a low electric potential. When the socket 40 receives a JTAG test module, PIN10 is enabled, thereby outputting a high electric potential. When the transmission terminal set 421 has to function with bidirectional data transmission, the write protection function of PIN12 must be disabled. On the contrary, when PIN12 is enabled, the transmission terminal set 421 allows only output function.

The logic circuit 60 is a logical operation controlled circuit comprised of an AND gate 61 and two NOT gates 62 and 63. The NOT gate 63 is electrically connected to the transmission circuit 70 through a logic output terminal set 64 for inputting of the logic operation result of the logic circuit 60. Only when PIN10 outputs a high electric potential and PIN 12 outputs a low electric potential, the logic output terminal set 64 outputs a logic LOW potential to the transmission circuit 70.

The transmission circuit 70 is comprised of a buffer 71 that is developed by CMOS logic technology from Toshiba Corporation. The buffer 71 is a low voltage octal bus transceiver designed for high speed and high performance operation and low power dissipation, wherein PIN1 determines the direction of data transmission; PIN19 determines whether enabling the buffer 71, i.e., the buffer 71 is disabled when PIN19 is enabled. For purposed design of the transmission circuit 70, PIN1 and PIN19 of the buffer 71 are shorted to have the same logic input. The 6 signal pins 42 of the transmission terminal set 421 are respectively connected to PIN2, PIN4, PIN6, PIN8, PIN9 and PIN13 of the buffer 71, and the corresponding PIN 18, PIN16, PIN14, PIN12, PIN11 and PIN7 are respectively connected to the control interfaces of TRST, TDI, TMS, TCK, TDO and RESET of the JTAG interface 52. Therefore, when the buffer 71 is enabled, the transmission circuit 70 can transmit JTAG test signal.

When the peripheral connector 2 is under the condition of connecting a normal storage device, i.e., when a SD card is inserted into the socket 40, PIN10 of the switching terminal set 422 outputs a low electric potential, causing the logic output terminal set 64 of the logic circuit 60 to output a logic HIGH potential to disable the buffer 71, therefore the transmission terminal set 421 works with the SD interface 51 directly for transmission data. When the circuit system of the computer needs to perform a maintenance or test work, i.e., when a JTAG test module is inserted into the socket 40, PIN10 is driven to output a high electric potential and PIN12 is at a low electric potential of electrically connecting to circuit ground, thereby causing the logic output terminal set 64 of the logic circuit 60 to output a logic LOW potential to enable the buffer 71, therefore the transmission terminal set 421 works with the JTAG interface 52 directly for transmission of JTAG test signal. Simply by connecting the test module to the peripheral connector 2, the computer can complete boundary scan test work easily without the procedure of taking out the test access port from the circuit board again as performed in the prior art design.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A peripheral connector comprising:
   a peripheral signal terminal set for electrically connecting a peripheral interface of a microcomputer;
   a test signal terminal set for electrically connecting a boundary scan interface of the microcomputer;
   a socket having an input terminal set for electrically connecting one of a peripheral device compatible to the peripheral interface and a test module compatible to the boundary scan interface, a switching terminal set for detecting one of the peripheral device and the test module that is electrically connected to the input terminal set and outputting an electric potential corresponding to the detected result, and a transmission terminal set which is a digital data transmission interface electrically connected to the peripheral signal terminal set; and
   a converting unit having a logic circuit and a transmission circuit; wherein the transmission terminal set and the test signal terminal set are electrically coupled by the transmission circuit for enabling the test module to conduct a boundary scan test on the microcomputer; wherein the logic circuit is electrically connected to the switching terminal set and the transmission circuit for converting the outputted electric potential of the switching terminal set into a digital control signal for controlling enablement or disablement of the transmission circuit.

2. The peripheral connector as claimed in claim 1, wherein the peripheral signal terminal set is electrically connected to a Secure Digital (SD) I/O interface of the microcomputer, and the test signal terminal set is electrically connected to a Joint Test Action Group (JTAG) test interface of the microcomputer.

3. The peripheral connector as claimed in claim 2, wherein the input terminal set of the socket comprises a plurality of metal connection terminals and a plurality of signal pins corresponding to the metal connection terminals; wherein the signal pins comprises 6 pins that form the transmission terminal set and 2 pins that form the switching terminal set.

4. The peripheral connector as claimed in claim 3, wherein the logic circuit comprises an AND gate electrically connected to one pin of the switching terminal set.

5. The peripheral connector as claimed in claim 4, wherein when a SD card is inserted in the socket and electrically connected to the input terminal set, the pin of the switching terminal set that is electrically connected to the AND gate outputs a low electric potential causing the logic circuit to output a logic HIGH potential to disable the transmission circuit.

6. The peripheral connector as claimed in claim 4, wherein when a JTAG test module is inserted in the socket and electrically connected to the input terminal set, the two pins of the switching terminal set respectively output a high electric potential and a low electric potential causing the logic circuit to output a logic LOW potential to enable the transmission circuit for transmission of JTAG test signal.

7. The peripheral connector as claimed in claim 4, wherein the logic circuit further comprises two NOT gates electrically connected to the said AND gate; wherein one of the two NOT gates is electrically connected to the transmission circuit.

8. The peripheral connector as claimed in claim 1, wherein the transmission circuit comprises a buffer developed by CMOS logic technology, the buffer having two signal pins for controlling direction of data transmission and enablement of the buffer respectively; wherein the two signal pins are electrically shorted.

* * * * *